United States Patent [19]

Aadsen et al.

[11] Patent Number: 4,872,168
[45] Date of Patent: Oct. 3, 1989

[54] INTEGRATED CIRCUIT WITH MEMORY SELF-TEST

[75] Inventors: Duane R. Aadsen, Moores Township, Northampton County, Pa.; Sunil K. Jain, North Andover, Mass.; Charles E. Stroud, North Aurora, Ill.

[73] Assignee: American Telephone and Telegraph Company, AT&T Bell Laboratories, Murray Hill, N.J.

[21] Appl. No.: 914,411

[22] Filed: Oct. 2, 1986

[51] Int. Cl.$^4$ .......................................... G01R 31/28
[52] U.S. Cl. ................................. 371/21.3; 371/22.4
[58] Field of Search ................... 371/21, 25; 324/73 R

[56] References Cited

U.S. PATENT DOCUMENTS

| | | | |
|---|---|---|---|
| 3,751,649 | 8/1973 | Hart, Jr. ............................ | 371/21 X |
| 3,863,227 | 1/1975 | Sanabria ............................ | 371/21 |
| 4,061,908 | 12/1977 | de Jonge et al. ................... | 371/21 |
| 4,342,084 | 7/1982 | Sager et al. ........................ | 364/200 |
| 4,369,511 | 1/1983 | Kimura et al. ..................... | 371/21 |
| 4,429,389 | 1/1984 | Catiller ............................... | 371/21 |
| 4,441,074 | 4/1984 | Bockett-Pugh et al. .......... | 371/25 X |
| 4,488,300 | 12/1984 | Horey et al. ....................... | 371/21 |
| 4,502,131 | 2/1985 | Giebel ................................ | 371/21 |
| 4,503,536 | 3/1985 | Panzer ............................... | 371/25 |
| 4,594,711 | 6/1986 | Thatte ................................ | 371/25 |

OTHER PUBLICATIONS

1981 IEEE Test Conference, "Paragons for Memory Test", Paper 3.3, pp. 44–48, by S. Winegarden and D. Pannell, Amdahl Corp.
1985 International Test Conference, "Self-Test of Random Access Memories", Paper 10.1, pp. 352-355, by P. Bardell & W. McAnney.
1984 International Test Conference, "Self-Testing of Embedded RAMS", Paper 4.3, pp. 148-156, by Z. Sun and L. Wang.
1981 IEEE Test Conference, "The Self-Assist Test Approach to Embedded Arrays", Paper 9.1, pp. 203-207, by D. Westcott, IBM.
IEEE Transactions on Computers, vol. C-27, No. 6, Jun. 1978, "Efficient Algorithms for Testing Semiconductor Random-Access Memories", pp. 572-576, by R. Nair, S. Thatte, & J. Abraham.
IEEE Transactions on Computers, vol. C-28, No. 6, Mar. 1979, "Comments on an Optimal Algorithm for Testing Stuck-at Faults in Random Access Memories", pp. 258-261, by Ravindra Nair, IBM, Thomas J. Watson Research Center.
IEEE Transactions on Computers, vol. C-26, No. 11, Nov. 1977, "An Optimal Algorithm for Testing Stuck-at Faults in Random Access Memories", pp. 1141-1144, by J. Knaizuk, Jr. and Carlos R. P. Hartmann.
IEEE Design and Test, "Built-In Self-Test Techniques", Apr. 1985, pp. 21-28, by E. McCluskey, Stanford University.
IEEE Transactions on Computers, vol. C-29, No. 6, Jun. 1980, "Test Procedures for a Class of Pattern-Sensitive Faults in Semiconductor Random-Access Memories", pp. 419-429, by Dong S. Suk and Sudhakar M. Reddy.

Primary Examiner—Charles E. Atkinson
Attorney, Agent, or Firm—James H. Fox

[57] ABSTRACT

A memory array included with logic circuitry on an integrated circuit is tested by a technique that reads and writes a specified sequence of test bits into a given memory word before progressing to the next word. A checkerboard pattern of 1's and 0's is written into the physical memory locations. This provides for an improved worst-case test while allowing ease of implementation for the test circuitry. The test results from a comparator circuit may be compressed to provide one (or a few) test flags indicating whether the memory passed the test, requiring a minimal number of test pads or terminals for the chip.

10 Claims, 5 Drawing Sheets

FIG. 2

|  | COLUMNS | | | | | | | | | | | | | | | |
|---|---|---|---|---|---|---|---|---|---|---|---|---|---|---|---|---|
| ROWS | 1 | 2 | 3 | 4 | 5 | 6 | 7 | 8 | 9 | 10 | 11 | 12 | 13 | 14 | 15 | 16 |
| N1 | ADD 4 D1 | ADD 3 D1 | ADD 2 D1 | ADD 1 D1 | ADD 4 D2 | ADD 3 D2 | ADD 2 D2 | ADD 1 D2 | ADD 4 D3 | ADD 3 D3 | ADD 2 D3 | ADD 1 D3 | ADD 4 D4 | ADD 3 D4 | ADD 2 D4 | ADD 1 D4 |
| N2 | ADD 8 D1 | ADD 7 D1 | ADD 6 D1 | ADD 5 D1 | ADD 8 D2 | ADD 7 D2 | ADD 6 D2 | ADD 5 D2 | ADD 8 D3 | ADD 7 D3 | ADD 6 D3 | ADD 5 D3 | ADD 8 D4 | ADD 7 D4 | ADD 6 D4 | ADD 5 D4 |
| N3 | ADD 12 D1 | ADD 11 D1 | ADD 10 D1 | ADD 9 D1 | ADD 12 D2 | ADD 11 D2 | ADD 10 D2 | ADD 9 D2 | ADD 12 D3 | ADD 11 D3 | ADD 10 D3 | ADD 9 D3 | ADD 12 D4 | ADD 11 D4 | ADD 10 D4 | ADD 9 D4 |
| N4 | ADD 16 D1 | ADD 15 D1 | ADD 14 D1 | ADD 13 D1 | ADD 16 D2 | ADD 15 D2 | ADD 14 D2 | ADD 13 D2 | ADD 16 D3 | ADD 15 D3 | ADD 14 D3 | ADD 13 D3 | ADD 16 D4 | ADD 15 D4 | ADD 14 D4 | ADD 13 D4 |
| N5 | ADD 20 D1 | ADD 19 D1 | ADD 18 D1 | ADD 17 D1 | ADD 20 D2 | ADD 19 D2 | ADD 18 D2 | ADD 17 D2 | ADD 20 D3 | ADD 19 D3 | ADD 18 D3 | ADD 17 D3 | ADD 20 D4 | ADD 19 D4 | ADD 18 D4 | ADD 17 D4 |
| N6 | ADD 24 D1 | ADD 23 D1 | ADD 22 D1 | ADD 21 D1 | ADD 24 D2 | ADD 23 D2 | ADD 22 D2 | ADD 21 D2 | ADD 24 D3 | ADD 23 D3 | ADD 22 D3 | ADD 21 D3 | ADD 24 D4 | ADD 23 D4 | ADD 22 D4 | ADD 21 D4 |
| N7 | ADD 28 D1 | ADD 27 D1 | ADD 26 D1 | ADD 25 D1 | ADD 28 D2 | ADD 27 D2 | ADD 26 D2 | ADD 25 D2 | ADD 28 D3 | ADD 27 D3 | ADD 26 D3 | ADD 25 D3 | ADD 28 D4 | ADD 27 D4 | ADD 26 D4 | ADD 25 D4 |
| N8 | ADD 32 D1 | ADD 31 D1 | ADD 30 D1 | ADD 29 D1 | ADD 32 D2 | ADD 31 D2 | ADD 30 D2 | ADD 29 D2 | ADD 32 D3 | ADD 31 D3 | ADD 30 D3 | ADD 29 D3 | ADD 32 D4 | ADD 31 D4 | ADD 30 D4 | ADD 29 D4 |

INTEGRATED CIRCUIT WITH MEMORY SELF-TEST

BACKGROUND OF THE INVENTION

1. Field of the Invention

The present invention relates to integrated circuits having a memory array and the capability for testing the memory.

2. Description of the Prior Art

The use of memory arrays integrated with logic circuitry, referred to as "embedded memories" or "application specific memories", results in a memory array that is more difficult to test than a conventional discrete memory integrated circuit (IC). This is due largely to the fact that the access to the memory array itself is limited. That is, the input/output terminals are usually devoted to the logic functions that the IC is intended to perform, and the memory array itself is not directly accessible to the user. Therefore, the testing is usually limited to storing and retrieving data through the intervening logic circuitry, which may not provide a complete test. Furthermore, even if any error is detected, it is frequently not clear whether the logic circuitry or the memory array is at fault. That information is very useful when debugging new designs, and for monitoring processing conditions during production, for example.

One technique for testing the memory array itself is to provide test pads on the integrated circuit that are devoted to the memory array. However, that results in a substantial increase in the integrated circuit area, which is not usually economically feasible. Furthermore, the time required for testing a large memory array is substantial. In addition, the package test may then not be as complete as the wafer test, reducing the ability to detect faults at the package test. Another known technique is to include on the integrated circuit a test generator that generates a known sequence of test bits that are written into the array. The test bits are then read from the array, and compared with the known pattern in a signature recognition circuit. However, the prior art techniques have not yielded as complete a test as is desired, since the signatures used have typically not simulated worst-case conditions very closely.

When the test circuitry is included on the same IC as the memory, the test circuitry should also be tested. However, this is typically very difficult using prior art test techniques. Finally, the custom logic designs of the prior art signature generation and recognition circuitry are not very regular. Hence, they are difficult to partition when computer-aided design (CAD) techniques are used, especially the CAD techniques that group the circuitry into blocks.

SUMMARY OF THE INVENTION

We have invented a test technique implemented in an integrated circuit that includes a memory array. Test information is written into sequential memory word addresses so as to form a checkerboard pattern in physically adjacent memory locations. In the case of a static memory cell having two inverters that are crosscoupled, each inverter is considered to be a memory location. A memory address generator may be used to provide the proper test bits to each location. An expected data generator and comparator circuitry may be used to compare the information read from a given memory location with the information written into that location. Alternately, signature analysis circuitry may be used for this purpose. Data compression circuitry may be included to reduce the number of test flags used to signal the results of each test.

BRIEF DESCRIPTION OF THE DRAWING

FIG. 2 is a typical layout of memory cells that shows the local addresses and the physical locations.

DETAILED DESCRIPTION

The following detailed description relates to an integrated circuit having a memory array and a selftesting capability for the memory. Other circuitry may be included on the IC, making the memory a so-called "application specific" memory, alternately referred to as an "embedded memory". If desired, the self-test capability of the present invention may be included with a discrete (i.e., stand-alone) memory chip. The present technique will be illustrated in terms of a static memory wherein a multiple- bit word is accessed. The present technique initially writes a checkerboard pattern (alternating "1's" and "0's") into physical memory locations in the memory array. In the case of a static memory having a cross-coupled cell, this means that the alternating pattern be written so that the voltage state of adjacent inverters define the alternating pattern. The test sequence provides for reading the information from a given address location (which may comprises multiple bits), and comparing the information with the known test information for that location. The test is then performed on the next memory address, and so forth, until all of the memory address locations in the memory array have been tested. The tests may then be repeated in the reverse direction (i.e., starting at the last memory address location) if desired. Note that the present sequential read-and-compare technique is in contrast to prior art techniques that read out an entire memory array (or large portion thereof) into circuitry that compares the information with the expected test values.

In the present technique, the detection of faults is provided by the following test conditions:

A. Condition 1: Each cell undergoes
  i. a 0 to 1 transition
  ii. a 1 to 0 transition and is read after each of these transitions.
B. Condition 2: For every pair of adjacent (in the physical layout) cells i and j, the test writes
  i. cell i with 1 and cell j with 0
  ii. cell i with 0 and cell j with 1 and reads after each of these writes. This writing sequence produces the so-called "checkerboard" pattern referred to herein.
C. Condition 3: Each memory cell is read twice, after writing logic 1 and 0.
D. Condition 4: Some memory words are written and read with data having different logic values (i.e, 01 and 10 pair) on every pair of adjacent input data lines. This conditions tests the comparator that is described below.

Still other conditions may be imposed. For example, after writing into a cell, a hold time delay may be included before reading the cell. This tests for open conductors that make static memories behave as dynamic memories, and for capacitor hold time in the case of dynamic memories.

Figure 1:
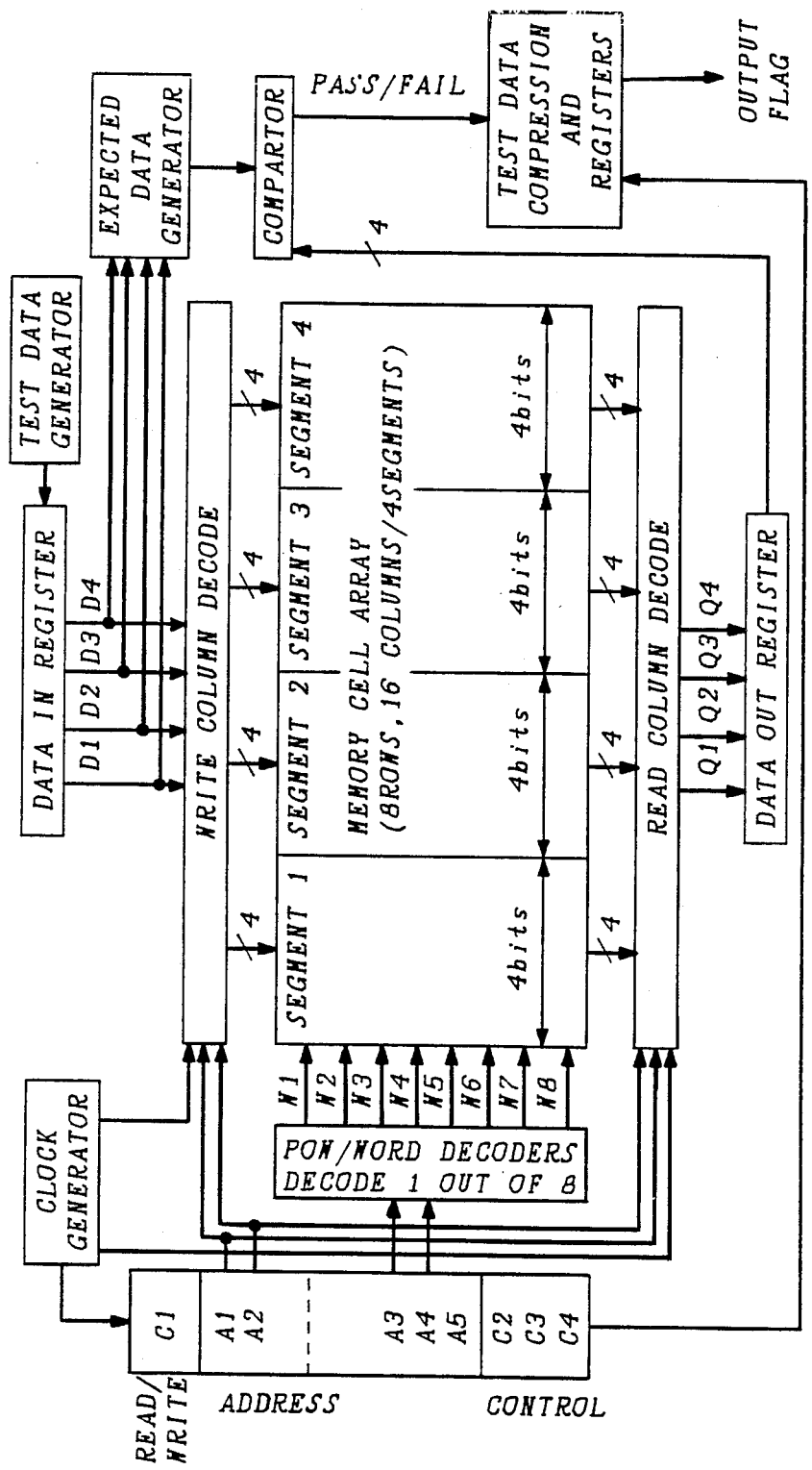
FIG. 1 shows a memory array and various circuits for testing according to the present technique.

Referring to FIG. 1, a typical random access memory layout is illustrated, wherein the memory array is divided into a number of segments. Each segment includes a multiplicity of adjacent columns. A single column is selected from each segment during a given read or write access operation. Therefore, the illustrative design provides for 4 bit access, with the present technique being useful with designs simultaneously accessing any number of multiple bits, or even only a single bit as noted below. The information accessed at a given memory address is referred to as a "word" herein, so that a 4 bit word is illustrated herein. To select a given word, address input circuitry provides address bits (A3...A5) to a row decoder to select a unique one of the rows, and also address bits (A1...A2) to a column decoder, which selects a unique one of the columns from each segment. The intersection of the selected row and columns determines the position of the word in the physical layout. One possible data bit mapping scheme from the word address to the physical word location is illustrated in FIG. 2. The address (ADD) is indicated, with each address comprising four bits (D1...D4). For example, address ADD 5 is physically located in row W2, columns 4, 8, 12 and 16. The following discussion will refer to the mapping of FIG. 2, with others being possible.

The present invention provides that in the case of memory cells having cross-coupled inverters, the checkerboard test pattern that is initially written into the memory array is defined by the inverter locations, rather than by the cells alone. For example, referring to FIG. 3, two 6 transistor "full CMOS" static memory cells are shown, with 4 transistor static cells (including two load resistors) being comparable for purposes of the present invention. The cells are located in adjacent columns (3 and 4) and along a common row (1). Each cell comprises two cross-coupled inverters, with transistors 302-303 and 304-305 forming inverters INV1 and INV2, respectively. The inverters are cross-coupled, thereby producing bi-stable voltage states so that when node 307 is high, then node 308 is low, and vice-versa. Node 307 is accessed by the "true" bit line D1 through access transistor 301, whereas node 308 is accessed by the "complement" bit line D1 (BAR) through access transistor 306. Note that inverter INV2 is physically adjacent to inverter INV3 in the adjacent memory cell. Hence, in writing a checkerboard pattern into the array according to the present inventive technique, node 308 is placed in the opposite voltage state as node 309. This is accomplished by either writing a "1" into both of the two adjacent cells shown, or by writing a "0" into both cells, considering that the stored memory state of a given cell is defined by the node accessed by the "true" bit line. Dynamic memory cell arrays may also be tested by the present technique, including dynamic cells using crosscoupled transistors that produce nodes at opposite voltage states, which are known in the art.

Figure 3:
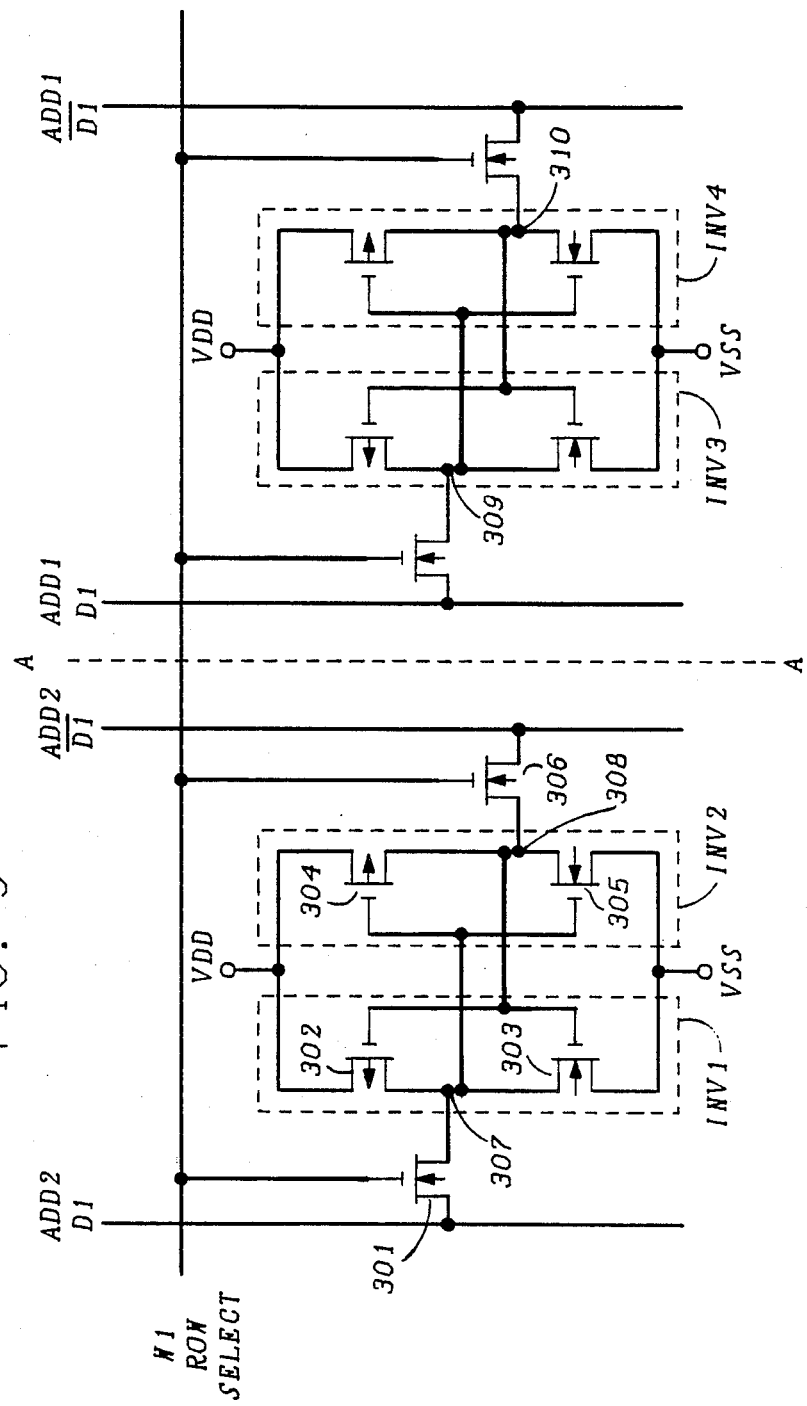
FIG. 3 shows schematically static memory cells that each comprise two inverters.
Figure 4:
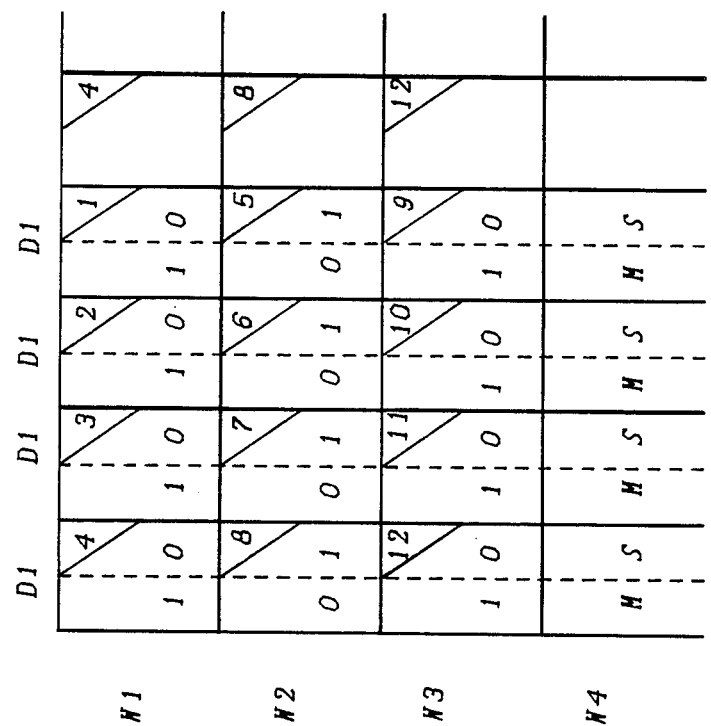
FIG. 4 shows the physical voltage states for the cells of FIG. 3 in the layout of FIG. 2.

If the pattern of "true" and "complement" bit lines continues as shown along an entire row, then an entire row of cells will be logically written with all "1's" or alternately all "0's" to obtain the desired physical checkerboard pattern of voltage states along the row (horizontal axis as viewed in FIG. 3). However, in some memory designs, the "true" and "complement" bit lines are mirror images between adjacent cells, as taken along the axis of symmetry A—A shown. Therefore, in such designs, the cells in a given row are written with alternating logical "1's" and "0's" to obtain the checkerboard voltage pattern in the physical inverter locations along the row. Still other arrangements of the bit lines are possible, with corresponding changes in the logical information written into the cells to obtain the physical checkerboard pattern. Note also that to obtain the checkerboard, the stored voltage states are also alternated in the vertical axis, as viewed in FIG. 3. That is, the cells in row 2 (below row 1 as viewed) have the opposite voltage state as those in row 1. Hence, if all logic "1's" are stored in row 1, then all logic "0's" are stored in row 2, and so forth for the remaining rows. The stored voltage states for the arrangement of FIG. 2 and memory cells of FIG. 3 are shown in FIG. 4, wherein the state of each inverter is indicated. The inverter that is accessed by the true bit line is referred to as the "master" (M), and the inverter accessed by the complement bit line as the "slave" (S), for each memory cell.

After initializing the array in the checkerboard pattern, the array is written with the inverse pattern (the "inverse checkerboard"), wherein the 1's and 0's are interchanged, in a subsequent pass through the array. This provides for testing the transition between the 0 and 1 states for each cell. A subsequent pass in the reverse direction then writes the initial checkerboard pattern into the cell, to check for transitions that may be affected by neighboring cells on the opposite side as those that could affect the test in the forward direction.

A presently preferred sequence of read and write operations that achieves the above conditions is as follows, wherein a pair of operations (e.g., write-read) implies that the operations are performed on a given word address before moving to the the next address. That is, the address counter increments by 1 digit in the forward direction, and decrements by 1 digit in the reverse direction. Hence, each read or write accesses 4 bits in the illustrative case. As indicated, the tests are performed in several passes through the entire memory array, starting from either the first memory address (forward direction), or from the last memory address (reverse direction). The "first" memory address is conventionally considered to be the 0 ... 0 address, and the "last" memory address is conventionally considered to be the 1 ... 1 address, but these designations may be reversed insofar as the present invention is concerned. Note also that the initial checkerboard pattern may begin with either a 1 or a zero.

TABLE

| SELF-TEST SEQUENCE | | |
|---|---|---|
| OPERATION | PATTERN | ADDRESS DIRECTON |
| Write-Read | Checkerboard | Forward |
| Read-Write | Inverse Checkerboard | Forward |
| Read-Read | " | Forward |
| Read-Write | Checkerboard | Reverse |
| Read-Read | " | Reverse |

Still other operations may be added in either the forward or reverse direction as desired. One significant feature of this sequence is the "double read", wherein two read operations are performed sequentially (without an intervening write operation) on a given memory word. This double read provides a test to determine whether the read operation itself affects the information stored in the word. Additional reads may be provided if desired (producing, e.g., a triple read).

A significant feature of operating on one memory address at a time is that the information read out of that location may be readily compared with the information written into that location. Furthermore, by performing the operations on sequential memory locations, both the word address and the test information written into the word may be readily generated by an address counter. Referring again to FIG. 1, the address register serves as an address counter when in the self-test mode. A read/write register (C1) and a control resister (C2 ... C4), under the control of a system clock determines whether a read or write test operation is being performed. And address bits A1 ... A5 are incremented (or decremented) so as to produce the desired address sequence through the memory array during a test. Furthermore, control register bits C2, C3 and C4 are used to determine which of the five memory test operations in the above Table are being conducted. The Data In Generator produces the actual test data read into each word (4 bits per word in the illustrative case), whereas the Expected Data Generator provides an identical test word for comparison in the comparator. The Expected Data Generator function may be combined with the Data In Generator. However, they are desirably separate to provide a self-check of the Data In Generator. The comparator provides a comparison on each bit of the test word read out of the memory array during a read operation. If the bits are identical with those from the Expected Data Generator, then a "pass" signal is sent from the comparator; otherwise, a "fail" signal is sent. The output of the comparator is sent to a Data Compression circuit in the preferred embodiment, so that if any one of the test words fail in the entire array, then a "flag" is set to the "fail" state, and supplied to an external terminal of the integrated circuit. In this manner, the self-test may be conducted even after the integrated circuit is packaged and operating in a system, if desired. An additional test may be provided by the test circuitry that allows full testing of the comparator and all data columns adjacent to each other. This test moves a logic 0 through a field of logic 1's in a data word that is both written and read for each bit position of the zero in the word. This is followed by a comparable test that moves a logic 1 through a field of logic zeros in a data word.

Figure 5:
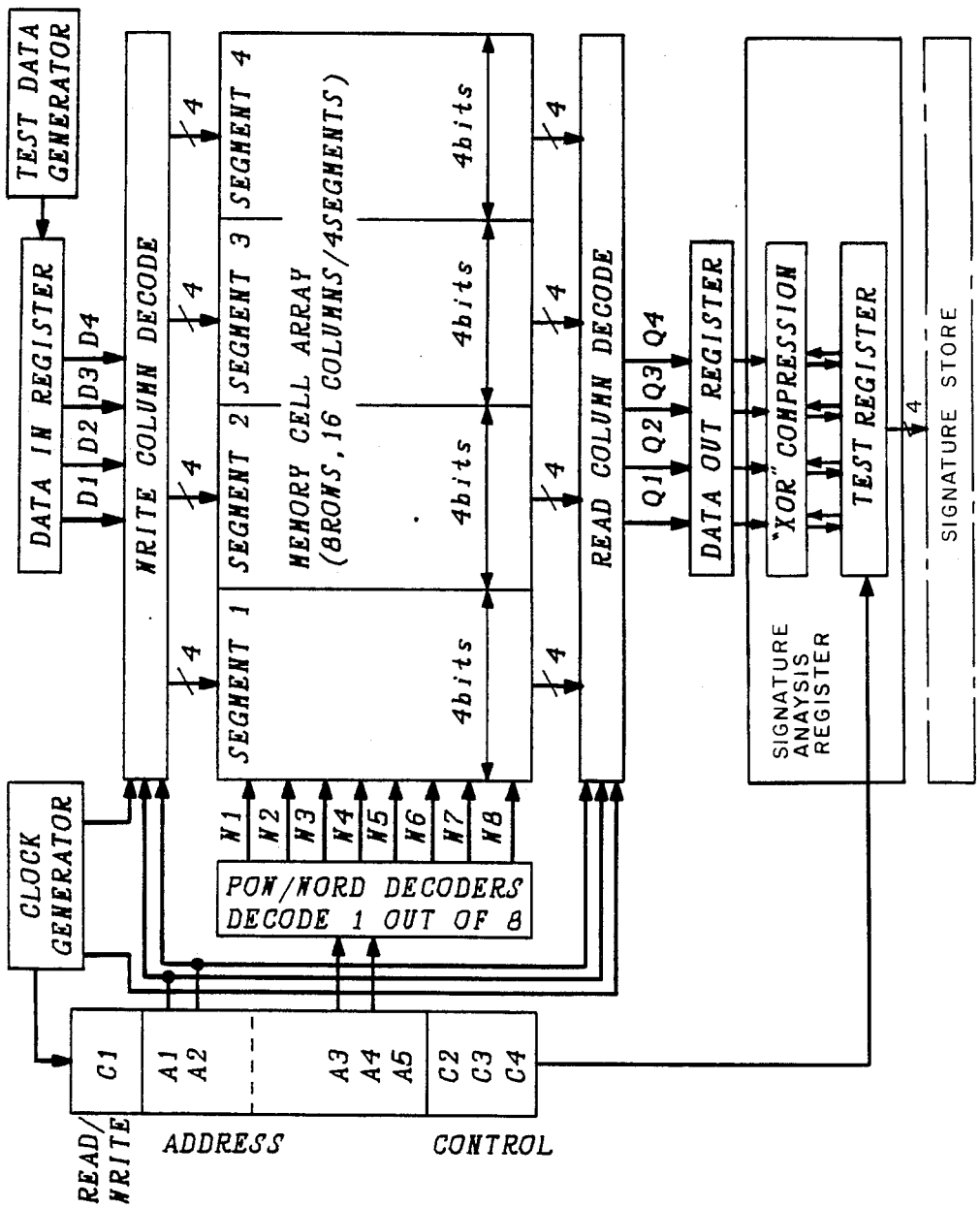
FIG. 5 shows an alternate embodiment of the present invention wherein signature analysis is utilized.

As an alternative to the test comparator shown herein, signature analysis techniques may be used. In that case, each read of a word under test places the information in a test register, after performing on exclusive "OR" ("XOR") with the previous contents of the register. Each bit of the test register is then compared to an expected value that may be stored in a read only memory (ROM), which may be either on the same chip as the test circuitry, or on an external chip. This embodiment of the invention is illustrated in FIG. 5. Thus, by combining several words before examining the test register, the test data is "compressed" in this case also, so that relatively fewer bits need to be examined than the total read out of the word under test.

What is claimed is:

1. An integrated circuit comprising an array of memory cells, and address decoding circuitry for accessing a word of information in said array for each word address supplied thereto, characterized in that said memory cells each comprise crosscoupled inverters having bi-stable nodes that in operation are stable in opposite voltage states, and said integrated circuit further comprises self-test circuitry comprising address counter means for providing sequential word addresses to said decoding circuitry, means for writing test information into each word so as to produce a checkerboard pattern of alternating logic 1 and 0 test voltage states into physically adjacent bi-stable nodes of said array, means for reading each word after writing test information into the word, and means for compressing the test information read from the words in said array in order to reduce the number of bits that are supplied externally to the integrated circuit.

2. The integrated circuit of claim 1 wherein said address counter provides for writing an inverse checkerboard pattern of alternating 1's and 0's into physically adjacent memory locations of said array.

3. The integrated circuit of claim 1 wherein said means for reading reads the test information from a given word at least twice without an intervening write operation into the given word.

4. The integrated circuit of claim 1 wherein said address counter means provides for at least one forward test sequence of addresses beginning at the first memory word address and ending at the last memory address, and at least one reverse test sequence of addresses beginning at the last memory word address and ending at the first memory word address.

5. The integrated circuit of claim 1 wherein said self-test circuitry provides for test operations in a given word address direction comprising the following: write-read, forward; read-write, forward; read-read, forward; read-write, reverse; and read-read, reverse.

6. The integrated circuit of claim 1 wherein said means for writing test information into the words is controlled by said address counter means.

7. The integrated circuit of claim 1 wherein each word comprises a multiplicity of memory cells.

8. The integrated circuit of claim 1 wherein each memory cell is a static memory cell comprising a pair of cross-coupled inverters.

9. The integrated circuit of claim 1 wherein each memory cell is a dynamic memory cell comprising a pair of cross-coupled transistors.

10. The integrated circuit of claim 1 comprising an expected data generator, and a comparator for comparing the test data read from each word with the data generated by said expected data generator.

* * * * *